(12) United States Patent
Son et al.

(10) Patent No.: US 7,531,874 B2
(45) Date of Patent: May 12, 2009

(54) FIELD EFFECT TRANSISTORS INCLUDING SOURCE/DRAIN REGIONS EXTENDING BENEATH PILLARS

(75) Inventors: Youngwoong Son, Hwasung (KR); Jae-Man Yoon, Seoul (KR); Bong-soo Kim, Gyeonggi-do (KR); Hyeoungwon Seo, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 60 days.

(21) Appl. No.: 11/530,705

(22) Filed: Sep. 11, 2006

(65) Prior Publication Data

US 2007/0290258 A1 Dec. 20, 2007

(30) Foreign Application Priority Data

Jun. 19, 2006 (KR) .................. 10-2006-0054898

(51) Int. Cl.
*H01L 29/08* (2006.01)
(52) U.S. Cl. ................. 257/334; 257/330; 257/E29.262
(58) Field of Classification Search ................. 257/213, 257/283, 284, 288, 327–334, 346, 388, 900, 257/E21.382–E21.384, E21.4, E21.409–E21.41, 257/E21.424, E29.122, E29.266–E29.269, 257/E29.277, 623, E29.262
See application file for complete search history.

(56) References Cited

U.S. PATENT DOCUMENTS

| | | | |
|---|---|---|---|
| 5,480,838 A | 1/1996 | Mitsui | |
| 6,015,725 A | 1/2000 | Hirayama | |
| 7,348,628 B2 | 3/2008 | Yoon et al. | |
| 2002/0175365 A1* | 11/2002 | Hirayama | 257/329 |
| 2003/0164527 A1* | 9/2003 | Sugi et al. | 257/401 |
| 2005/0062101 A1* | 3/2005 | Sugi et al. | 257/330 |
| 2006/0043474 A1* | 3/2006 | Kinzer et al. | 257/330 |
| 2006/0113590 A1* | 6/2006 | Kim et al. | 257/330 |
| 2006/0170039 A1* | 8/2006 | Kim et al. | 257/330 |
| 2006/0289928 A1* | 12/2006 | Takaya et al. | 257/330 |
| 2007/0246783 A1* | 10/2007 | Moon et al. | 257/384 |

* cited by examiner

*Primary Examiner*—Lynne A. Gurley
*Assistant Examiner*—Vernon P Webb
(74) *Attorney, Agent, or Firm*—Myers Bigel Sibley & Sajovec, P.A.

(57) ABSTRACT

Field effect transistors include a substrate and a pillar that extends away from the substrate. The pillar includes a base adjacent the substrate, a top remote from the substrate, and a sidewall that extends between the base and the top. An insulated gate is provided on the sidewall. A first source/drain region is provided in the substrate beneath the pillar and adjacent the insulated gate. A second source/drain region that is heavily doped compared to the first source/drain region, is provided in the substrate beneath the pillar and remote from the insulated gate. The pillar may be an I-shaped pillar that is narrower between the base and the top compared to adjacent the base and the top, such that the sidewall includes a recessed portion between the base and the top.

21 Claims, 11 Drawing Sheets

FIELD EFFECT TRANSISTORS INCLUDING SOURCE/DRAIN REGIONS EXTENDING BENEATH PILLARS

FIELD OF THE INVENTION

This invention relates to microelectronic devices and fabrication methods, and more particularly to integrated circuit field effect transistors and fabrication methods therefor.

BACKGROUND OF THE INVENTION

Integrated circuit Field Effect Transistors (FETs), often referred to as Metal Oxide Semiconductor Field Effect Transistors (MOSFETs), Metal Insulator Semiconductor Field Effect Transistors (MISFETs), insulated gate field effect transistors, or simply as MOS/MIS devices, are widely used in integrated circuit logic, memory, processor, analog and/or other integrated circuits for consumer, commercial and/or other applications. As the integration density of integrated circuit field effect transistors continues to increase, the size of the active region and the channel length thereof may continue to decrease. With the reduction in the channel length of the transistor, the influence of the source/drain region upon the electric field or potential in the channel region may become considerable, giving rise to so called "short channel effects". Moreover, with the scaling down of the active areas, the channel width may decrease, which may also increase the threshold voltage of the device and/or give rise to other so-called "narrow width effects".

Vertical pillar transistors have been proposed in attempts to reduce these and/or other effects. In a vertical pillar transistor, a vertical channel may be provided in a pillar that extends from an integrated circuit substrate. A vertical pillar transistor is described in U.S. Pat. No. 5,480,838 to Mitsui, entitled "Method Of Manufacturing A Semiconductor Device Having Vertical Transistor With Tubular Double-Gate". FIG. 2 of Mitsui is reproduced as FIG. 1 herein. As stated in the Abstract of Mitsui, a semiconductor device allowing control of its threshold voltage without requiring change in the materials of its gate electrodes and suitable for high density integration is disclosed. The semiconductor device includes a p type monocrystalline silicon substrate 1 having a cylindrical portion with inner and outer surfaces and extending in a vertical direction. A first gate electrode 8 and a second gate electrode 10 are disposed at the inner surface and the outer surface of the cylindrical portion 2, respectively. A source/drain region 5 is formed on the top end of the cylindrical portion 2, while a source/drain region 3 is formed on the inner bottom surface of the cylindrical portion 2. Therefore, the cylindrical portion 2 can be utilized as a channel region of an MIS field effect transistor. The threshold voltage of the transistor can easily be controlled by applying separate voltages to the two gate electrodes, the first electrode and the second electrode.

Another vertical pillar field effect transistor is described in U.S. Pat. No. 6,015,725 to Hirayama, entitled "Vertical Field Effect Transistor and Manufacturing Method Thereof". FIG. 2 of Hirayama is reproduced as FIG. 2 herein. As stated in the Abstract of Hirayama, a vertical field effect transistor 1 and a method of manufacturing thereof are disclosed, in which a buried layer 3 of a conduction type opposite to that of a substrate 2 is formed to a predetermined depth in the substrate 2 by ion implantation. The bottom of recess 2a for forming a protrusion 2b on the substrate 2 is located within the corresponding one of the buried layer 3. The width of the recess 2a is set smaller than the width of the buried layer 3. The surface of the protrusion 2b and the bottom of the recess 2a are formed with impurities regions 4a, 4b; 5a, 5b constituting a source and a drain, respectively. A channel length L of the channel region formed on the sidewall of the protrusion 2b is defined by the distance between the buried layer 3 and the impurities regions 5a, 5b on the surface of the protrusion 2b.

Unfortunately, vertical pillar transistors as described above may also exhibit Gate-Induced Drain Leakage (GIDL), which may also reduce the performance of the vertical pillar transistor.

SUMMARY OF THE INVENTION

Field effect transistors according to some embodiments of the present invention include a substrate and a pillar that extends away from the substrate. The pillar includes a base adjacent the substrate, a top remote from the substrate, and a sidewall that extends between the base and the top. An insulated gate is provided on the sidewall. A first source/drain region is provided in the substrate beneath the pillar and adjacent the insulated gate. A second source/drain region that is heavily doped compared to the first source/drain region, is provided in the substrate beneath the pillar and remote from the insulated gate.

In some embodiments, the pillar is an I-shaped pillar that is narrower in an intermediate portion between the base and the top compared to adjacent the base and the top, such that the sidewall includes a recessed intermediate portion between the base and the top. The insulated gate may comprise an insulating layer that extends on the recessed portion and a gate electrode on the insulating layer remote from the sidewall. A trench isolation region also may be provided in the substrate outside the pillar, wherein the first and second source/drain regions extend in the substrate adjacent the trench isolation region.

In some embodiments, the second source/drain region extends further toward a central axis of the pillar than the first source/drain region. In other embodiments, the first source/drain region extends further toward the central axis of the pillar than the second source/drain region. In yet other embodiments, a third source/drain region also is provided in the substrate beneath the pillar and remote from the first source/drain region. The third source/drain region is lightly doped compared to the second source/drain region. In these embodiments, the second source/drain region may extend further towards the central axis of the pillar than the first and third source/drain regions.

Moreover, in some embodiments, the first and second source/drain regions may both extend to beneath the recessed portion. In other embodiments, the first source/drain region may extend to beneath the recessed portion and the second source/drain region may extend only part way to beneath the recessed portion. In still other embodiments, wherein the first, second and third source/drain regions are provided, the second source/drain region may extend to beneath the recessed portion, and the first and third source/drain regions may extend only part way to beneath the recessed portion.

In any of the above-described embodiments, a sidewall spacer may be provided on the gate electrode remote from the insulating layer. Moreover, the trench isolation region may extend in the substrate from outside the pillar to the sidewall spacer. Finally, in any of the above embodiments, a fourth source/drain region may be provided in the pillar adjacent the top.

Other embodiments of the present invention may provide field effect transistors that include an I-shaped pillar, but need not include the first and second source/drain regions in the substrate beneath the pillar. In particular, field effect transistors according to these embodiments may include a substrate and an I-shaped pillar that extends away from the substrate. The I-shaped pillar includes a base adjacent the substrate, a top remote from the substrate, and an intermediate portion between the base and top that is narrower than the base and top. An insulated gate is provided on the intermediate portion. A source/drain region is provided in the substrate adjacent the base.

In any of these embodiments, the insulated gate may include an insulating layer and a gate electrode on the insulating layer, and/or a trench isolation region may be provided in the substrate, as was already described. Moreover, in any of these embodiments, the source/drain region may include a first source/drain region, a second source/drain region and/or a third source/drain region, as was already described. A sidewall spacer and/or a fourth source/drain region also may be provided, as was described above.

Field effect transistors may be fabricated, according to various embodiments of the present invention, by etching a plurality of spaced apart pillars in an integrated circuit substrate. The pillars include a base adjacent the substrate, a top remote from the substrate and an intermediate portion between the base and the top that is narrower than the base and top. Insulated gates are formed on the intermediate portions. Ions are implanted into the substrate between the spaced apart pillars, to form source/drain regions. Annealing may then be performed to diffuse at least some of the implanted ions beneath the pillars. Some of the ions may already be located beneath the pillars prior to annealing.

In some embodiments, the source/drain regions are first source/drain regions, and the methods may further comprise etching the substrate between the spaced apart pillars to form a plurality of spaced apart trenches, and implanting ions into the trenches to form second source/drain regions in the substrate, beneath the first source/drain regions, that are more heavily doped than the first source/drain regions. In some embodiments, the ions are implanted into the trenches at an oblique angle relative to the substrate.

In other embodiments, ions are implanted into the substrate between the spaced apart pillars to form source/drain regions, by performing a first ion implantation to implant ions into the substrate between the spaced apart pillars to form first source/drain regions and by performing a second ion implantation at higher energy than the first ion implantation, to implant ions into the substrate between the spaced apart pillars and beneath the first source/drain regions to form second source/drain regions. The order of these ion implantations also may be reversed. Moreover, after performing these ion implantations, the substrate may be etched between the spaced apart pillars, to form a plurality of spaced apart trenches.

In still other embodiments, spacers are formed on the insulated gates, remote from the pillars, between the implanting of ions into the substrate between the spaced apart pillars to form first source/drain regions and the etching of the substrate between the spaced apart pillars to form the spaced apart trenches.

In yet other embodiments, implanting ions into the substrate to form source/drain regions is performed by performing a first ion implantation to implant first ions into the substrate between the spaced apart pillars and performing a second ion implantation at higher energy and higher density than the first ion implantation to implant second ions into the substrate between the spaced apart pillars, wherein the second ions have shorter diffusivity than the first ions. Annealing is then performed to form second source/drain regions in the substrate beneath the pillars and spaced apart therefrom, first source/drain regions that are lightly doped compared to the second source/drain regions, between the second source/drain regions and the pillars, and third source/drain regions that are lightly doped compared to the second source/drain regions, beneath the pillars and remote from the first source/drain regions. The substrate may then be etched between the spaced apart pillars, to form spaced apart trenches. An insulating layer may be formed in the spaced apart trenches.

DETAILED DESCRIPTION

Figure 1:
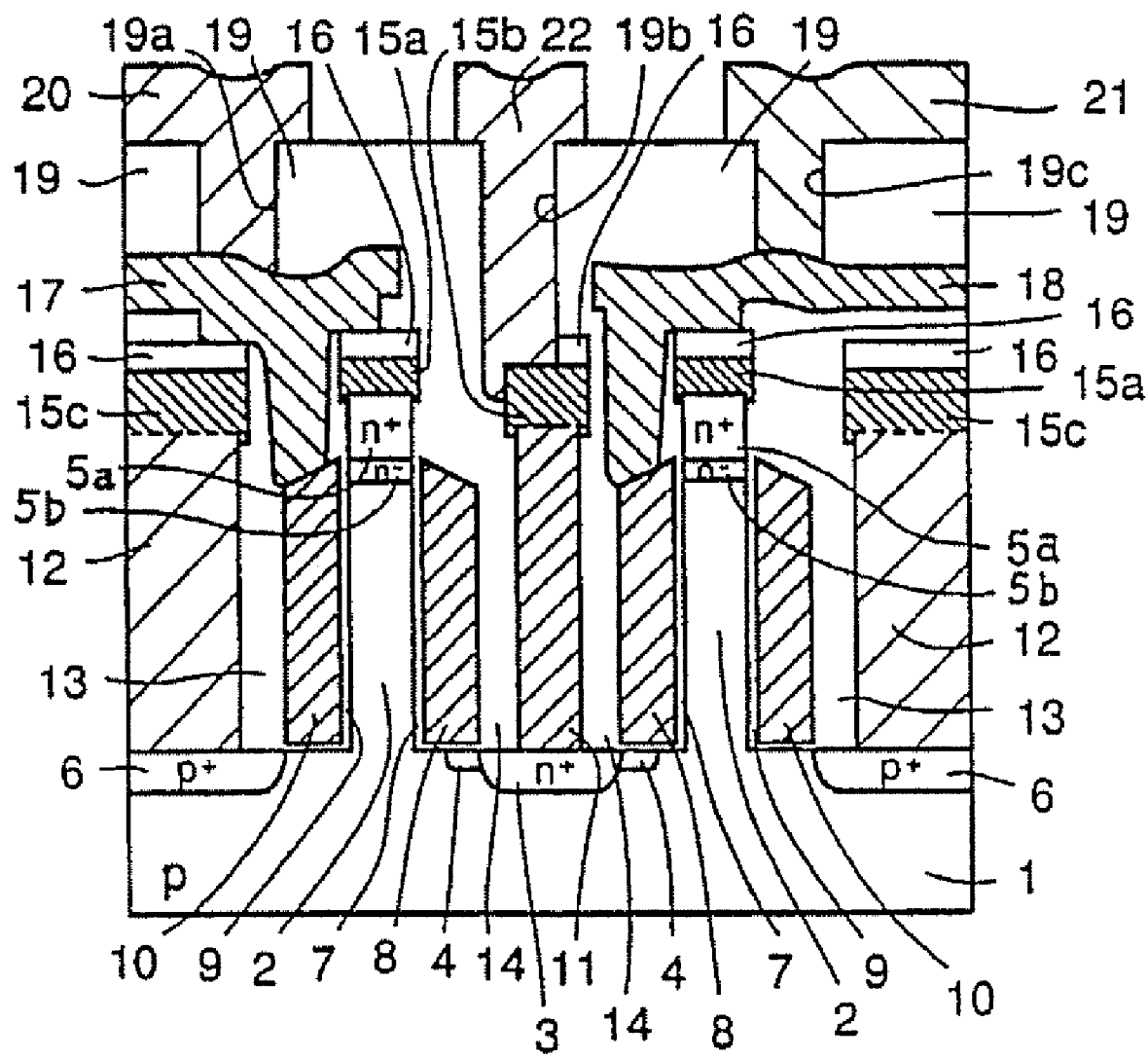
FIG. 1 is a reproduction of FIG. 2 of U.S. Pat. No. 5,480,838.
Figure 2:
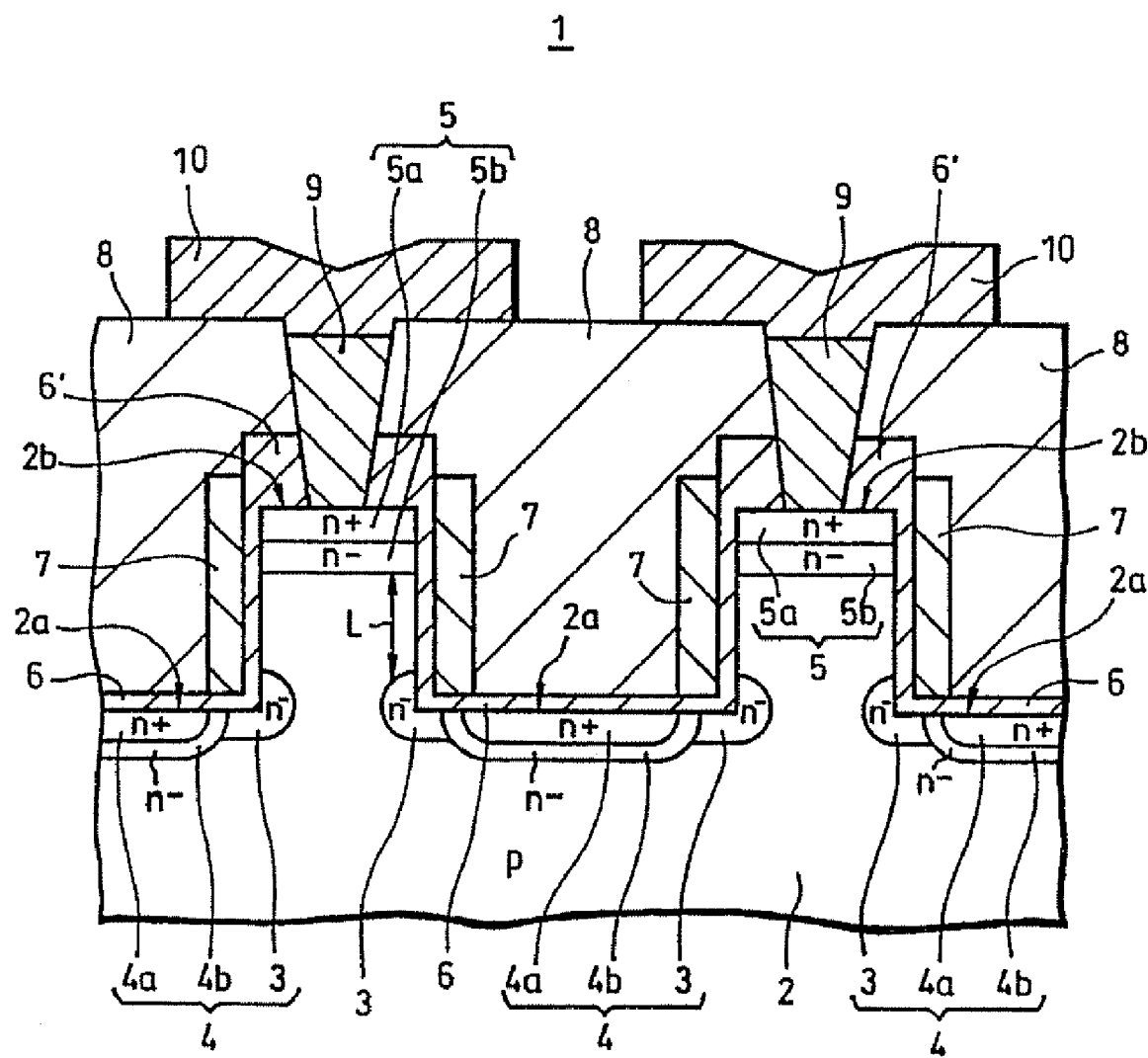
FIG. 2 is a reproduction of FIG. 2 of U.S. Pat. No. 6,015,725.

The invention will be described more fully hereinafter with reference to the accompanying drawings, in which example embodiments of the invention are shown. This invention may, however, be embodied in many different forms and should not be construed as limited to the example embodiments set forth herein. Rather, the disclosed embodiments are provided so that this disclosure will be thorough and complete, and will fully convey the scope of the invention to those skilled in the art. In the drawings, the size and relative sizes of layers and regions may be exaggerated for clarity. Moreover, each embodiment described and illustrated herein includes its complementary conductivity type embodiment as well. Like numbers refer to like elements throughout.

It will be understood that when an element or layer is referred to as being "on", "connected to" and/or "coupled to" another element or layer, it can be directly on, connected or coupled to the other element or layer or intervening elements or layers may be present. In contrast, when an element is referred to as being "directly on," "directly connected to" and/or "directly coupled to" another element or layer, there are no intervening elements or layers present. As used herein, the term "and/or" may include any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms may be used to distinguish one element, component, region, layer and/or section from another region, layer and/or section. For example, a first element, component, region, layer and/or section discussed below could be termed a second element, component, region, layer and/or section without departing from the teachings of the present invention.

Spatially relative terms, such as "below", "lower", "above", "upper" and the like, may be used herein for ease of description to describe an element and/or a feature's relationship to another element(s) and/or feature(s) as illustrated in the figures. It will be understood that the spatially relative terms are intended to encompass different orientations of the device in use or operation in addition to the orientation depicted in the figures. For example, if the device in the figures is turned over, elements described as "below" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

As used herein, a second region is "beneath" a first region if it is outside the first region but extends within a projection of the first region. Stated conversely, a second region is not beneath a first region if it lies totally outside a projection of the first region. Thus, for example, a source/drain region in the substrate is beneath a pillar that extends away from the substrate if the source/drain region extends within a projection of the pillar into the substrate. The source/drain region may be contained wholly within the projection of the pillar, but may also extend outside the projection and may also extend into the pillar itself. Stated conversely, a source/drain region is not considered beneath a pillar if it is entirely transversely offset from the projection of the pillar into the substrate. Moreover, the term "beneath" also indicates a relationship of one layer or region to another layer or region relative to the substrate, as illustrated in the figures.

The terminology used herein is for the purpose of describing particular embodiments only and is not intended to be limiting of the invention. As used herein, the singular terms "a", "an" and "the" are intended to include the plural forms as well, unless the context clearly indicates otherwise. It will be further understood that the terms "comprises," "comprising," "includes" and/or "including" when used in this specification, specify the presence of stated features, integers, steps, operations, elements, and/or components, but do not preclude the presence or addition of one or more other features, integers, steps, operations, elements, components, and/or groups thereof.

Example embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, may be expected. Thus, the disclosed example embodiments of the invention should not be construed as limited to the particular shapes of regions illustrated herein unless expressly so defined herein, but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention, unless expressly so defined herein.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Figure 3A:
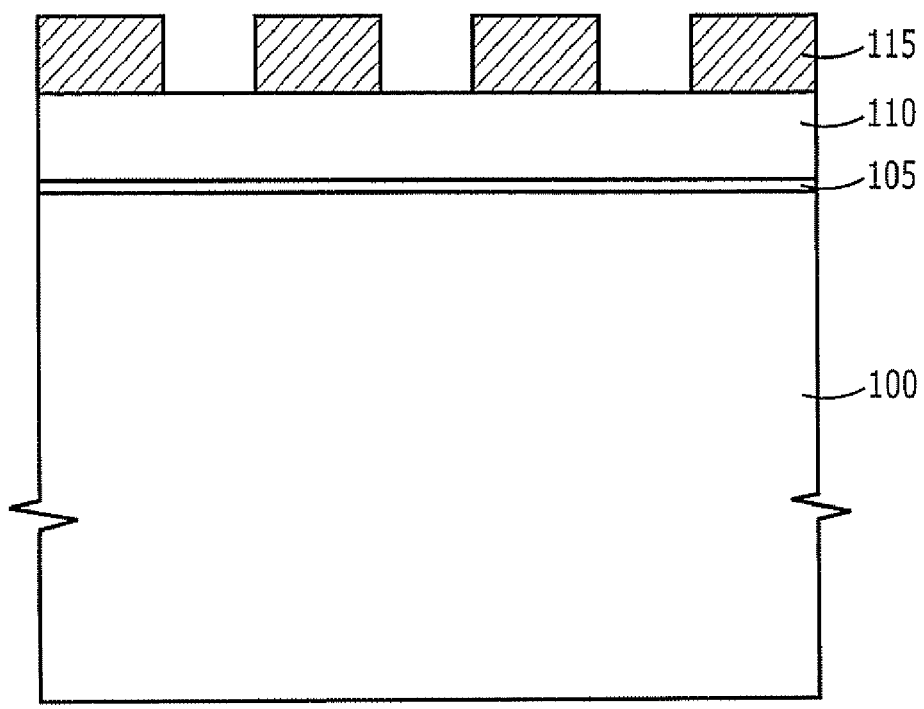
FIGS. 3A-3J are cross-sectional views of field effect transistors according to first embodiments of the present invention, during intermediate fabrication steps according to first embodiments of the present invention.

FIGS. 3A-3J are side cross-sectional views of methods of fabricating field effect transistors according to first embodiments of the present invention, and field effect transistors so fabricated. Referring now to FIG. 3A, a buffer oxide layer 105 may be formed on a substrate 100 using chemical vapor deposition, thermal oxidation and/or other conventional processes. The substrate 100 may include a single element and/or compound semiconductor bulk substrate or may include a single element and/or compound semiconductor layer on another substrate, commonly referred to as Semiconductor-On-Insulator (SOI) technology, and/or other substrate that is commonly used in microelectronic device fabrication.

Still referring to FIG. 3A, a mask layer 110, often referred to as a "hard mask", may be formed on the buffer oxide layer 105 using chemical vapor deposition and/or other conventional techniques. The mask layer material 110 may have a different etch rate than the buffer oxide layer 105. A photoresist pattern 115 is formed on the mask layer 110 by a conventional photoimaging process.

Figure 3B:
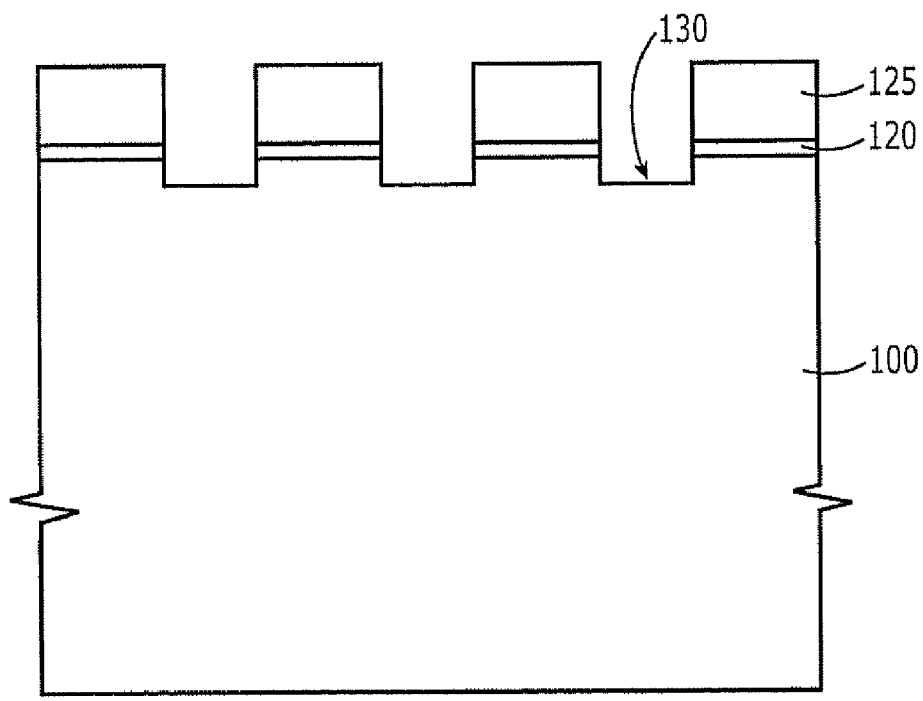

Referring now to FIG. 3B, first trenches 130 are formed by etching into the mask layer 110 and the buffer layer 105 to form a patterned mask layer 125 and a patterned buffer layer 120 as shown. As also shown, etching of the first trenches 130 may continue partially into the substrate 100. The photoresist 115 may then be removed. Other conventional etching techniques may be used.

Figure 3C:
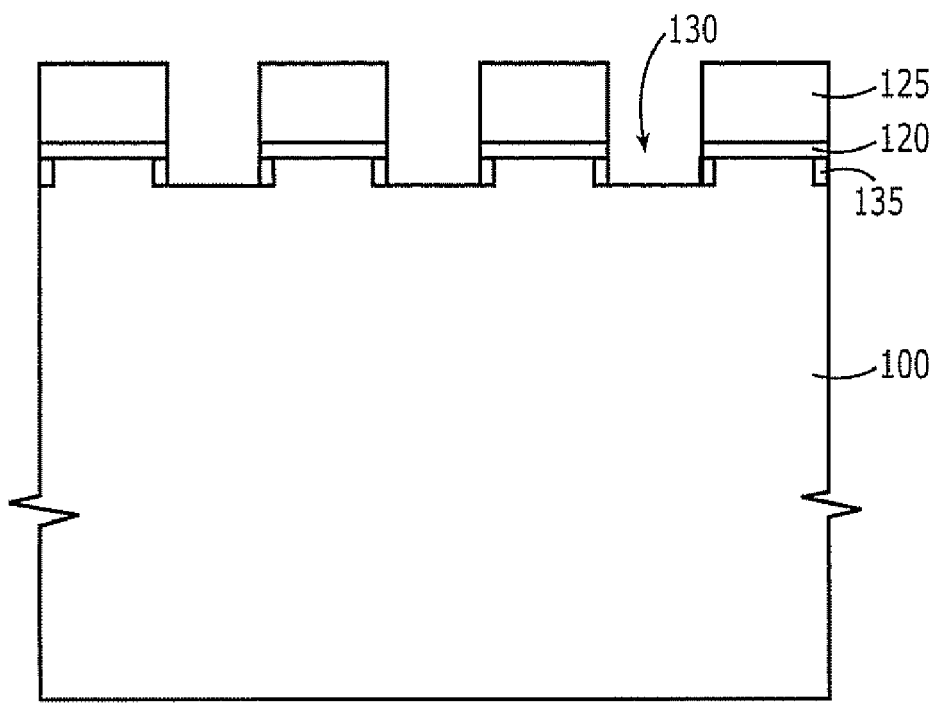

Referring now to FIG. 3C, a protective layer 135 is formed on the walls of the first trench 130, for example using a conventional chemical vapor deposition and etch back process. The protective layer may comprise oxide and/or nitride. The protective layer 135 may aid in forming an I-shaped pillar, as will be described below. However, in other embodiments, the protective layer 135 need not be used.

Figure 3D:
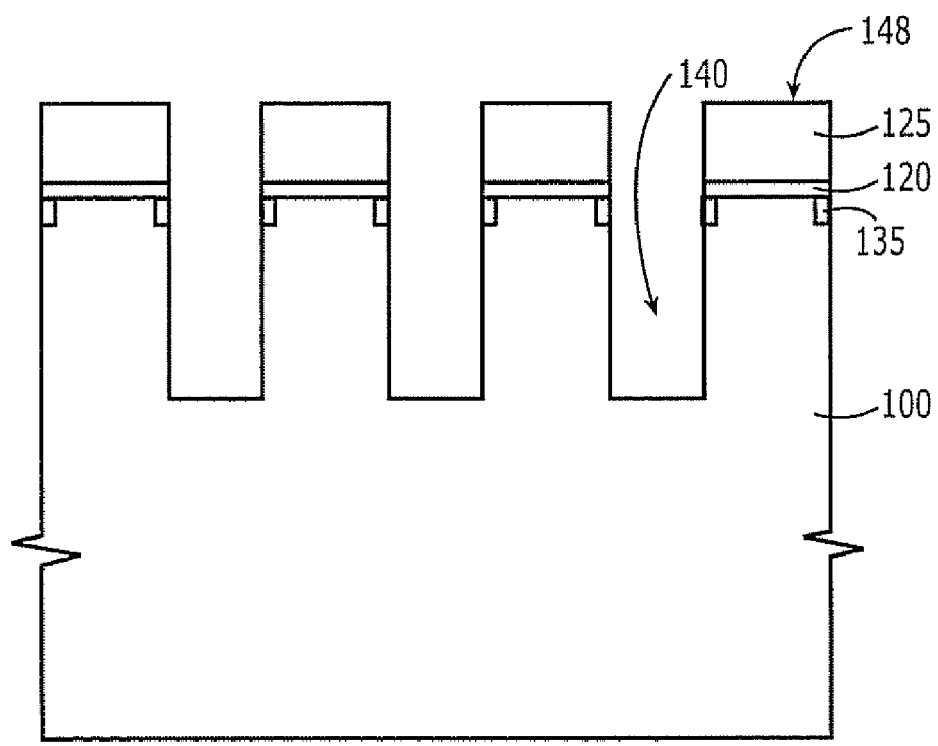
Figure 3E:
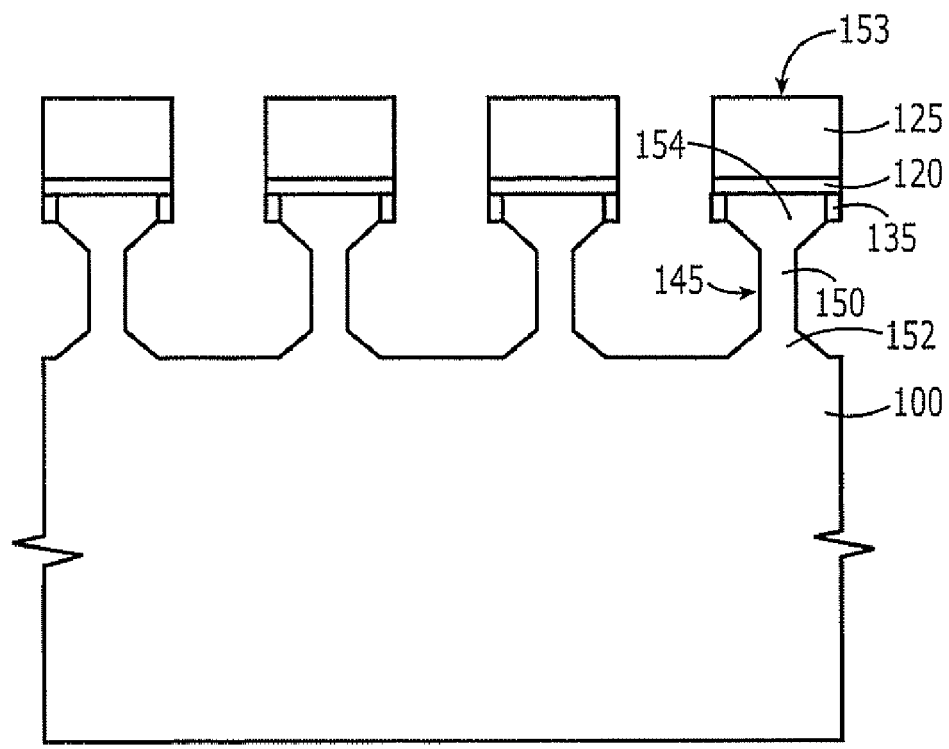
Figure 3F:
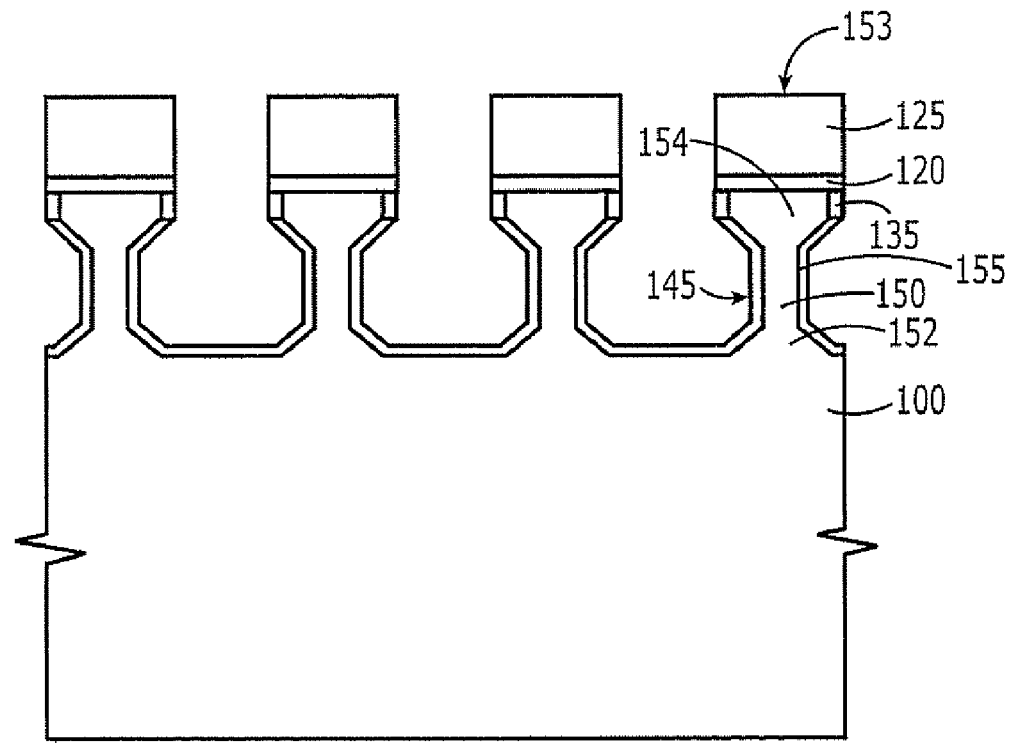

Referring now to FIG. 3D, the substrate 100 is etched, using the protective layer 135 as an etch mask, to form second trenches 140 that define a plurality of spaced apart pillar structures 148. Other etching techniques may be used.

Referring now to FIG. 5E, a combination of dry etching and wet etching (and/or other conventional techniques) may be performed to recess an intermediate portion of the sidewalls of the pillar structures 148, to thereby form a recessed portion 145 of the sidewalls. Accordingly, an I-shaped pillar structure 153 is formed, including a base 152 adjacent the substrate 100, a top 154 remote from the substrate 100, and an intermediate portion 150 between the base 152 and the top 154 that is narrower than the base 152 and the top 154. The intermediate portion 150 includes a recessed sidewall 145. The intermediate portion 150 can define a channel area, as will be described in detail below. Thus, an I-shaped pillar stricture 153 is formed. Other techniques for forming an I-shaped pillar also may be used.

Referring now to FIG. 1F, a gate insulation layer 155 is formed on the recessed sidewall 145 using, for example, chemical vapor deposition and etch back. The gate insulation later 155 may include conventional gate dielectrics, such as silicon dioxide and/or high dielectric constant materials, such as Hf$_2$O$_3$, Al$_2$O$_3$ and/or other materials. Other techniques such as thermal oxidation also may be used.

Figure 3G:
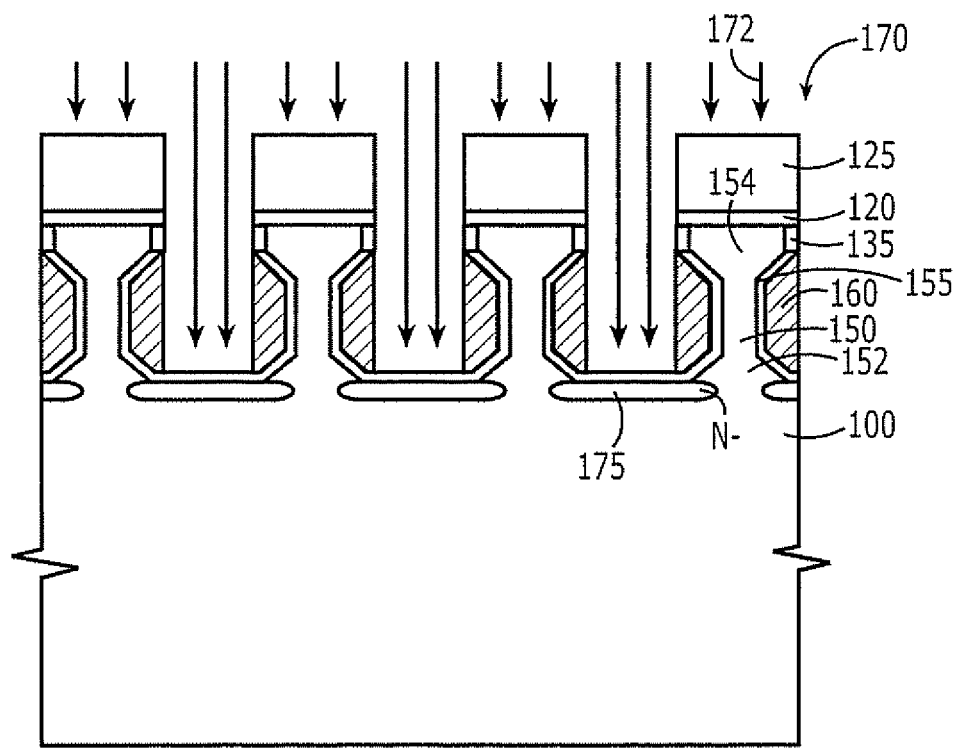

Referring now to FIG. 3G, a gate electrode 160 is formed on the gate insulation layer 155, for example by chemical vapor deposition and etch back and/or using other techniques. The gate electrode 160 may comprise polysilicon, metal and/or other conventional material used for gate electrodes. Thus, the gate insulation layer 155 and the gate electrode 160 form an insulated gate on the recessed sidewall 145. The pillars with the insulated gates on the recessed sidewalls thereof are denoted by reference number 170.

Still referring to FIG. 3G, a first source/drain region 175 is formed by implanting ions between the pillars 170, as shown by arrows 172. In some embodiments, N-type ions are implanted to form a lightly doped (N−) first source/drain regions 175, using orthogonal ion implantation. In other embodiments oblique implantation may be used. In some embodiments, prior to performing the first ion implantation 172, sidewall spacers may be formed on the sidewalls of the pillars 170 and then removed after the ion implantation 172. The first source/drain regions 175 may extend beneath the pillars 170, i.e., within a projection 176 of the pillars 170. In other embodiments, the first source/drain regions 175 may not extend beneath the pillars 170 until after a later performed anneal.

Figure 3H:
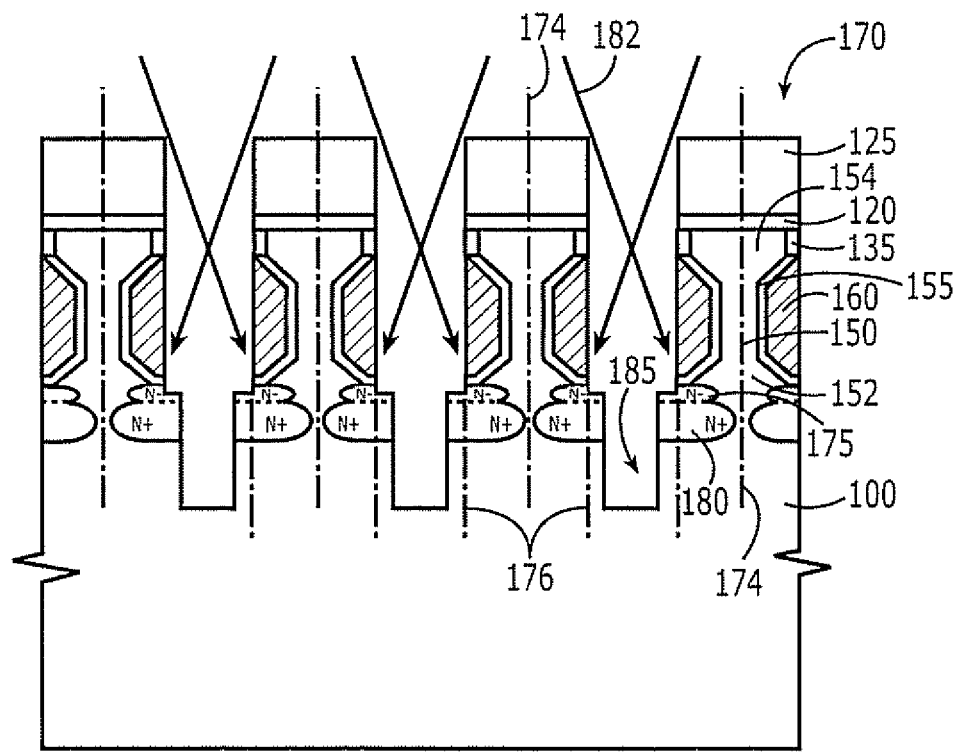

Referring now to FIG. 3H, the substrate is etched between the spaced apart pillars 170 to form third trenches 185. In some embodiments, the sidewall spacers that were optionally formed in FIG. 3G may be used to define the third trenches 185 to be narrower than the second trenches 140, as shown in FIG. 3H. Other techniques also may be used to form the third trenches 185.

Then, as shown in FIG. 3H, ions 182 are implanted into the third trenches 185 to form second source/drain regions 180 in the substrate 110 beneath the pillars 170 and beneath the first source/drain regions 175, and that are more heavily doped (N+) than the first source/drain regions 175. This second ion implantation 182 may take place at an oblique angle, as shown in FIG. 3H, so that the more heavily doped second source/drain regions 180 may extend further toward a central axis 174 of the pillars 170 than the first source/drain regions 175. The second ions 182 may be implanted deeper than the first ions 172 by implanting at a higher energy than the first ions. In other embodiments, orthogonal implantation and/or different energy may be used.

An anneal may then be performed to produce the final source/drain structure shown in FIG. 3H, wherein first source/drain regions 175 are provided in the substrate beneath the pillar, i.e., extending within the projections 176 of the pillar 170 and adjacent the insulated gate 155/160. Second source/drain regions 180 that are heavily doped (N+) compared to the first source/drain regions (N−) 175 are also provided in the substrate 100 beneath the pillar 170, and remote from the insulated gate 155/160. As also shown in FIG. 3H, in some embodiments, the second source/drain regions 180 may extend further toward the central axis 174 of the pillar 170 than the first source/drain regions 175. It will be understood that, in other embodiments, a separate anneal need not be performed.

Figure 3I:
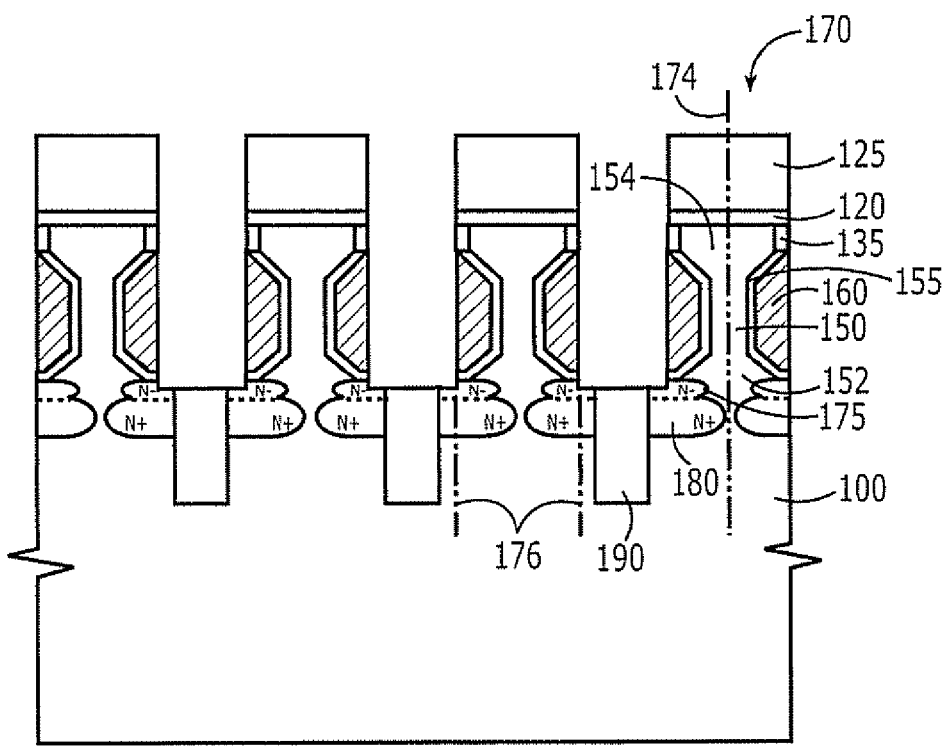

Referring now to FIG. 3I, an isolation layer 190, comprising, for example, silicon dioxide, is formed in the third trenches 185 using chemical vapor deposition and etch back and/or other conventional processes. In some embodiments, the isolation layer 190 fills the trenches 185. As shown in FIG. 3I, the first and second source/drain regions 175, 180, respectively, may extend in the substrate 100 adjacent the trench isolation layer 190.

Figure 3J:
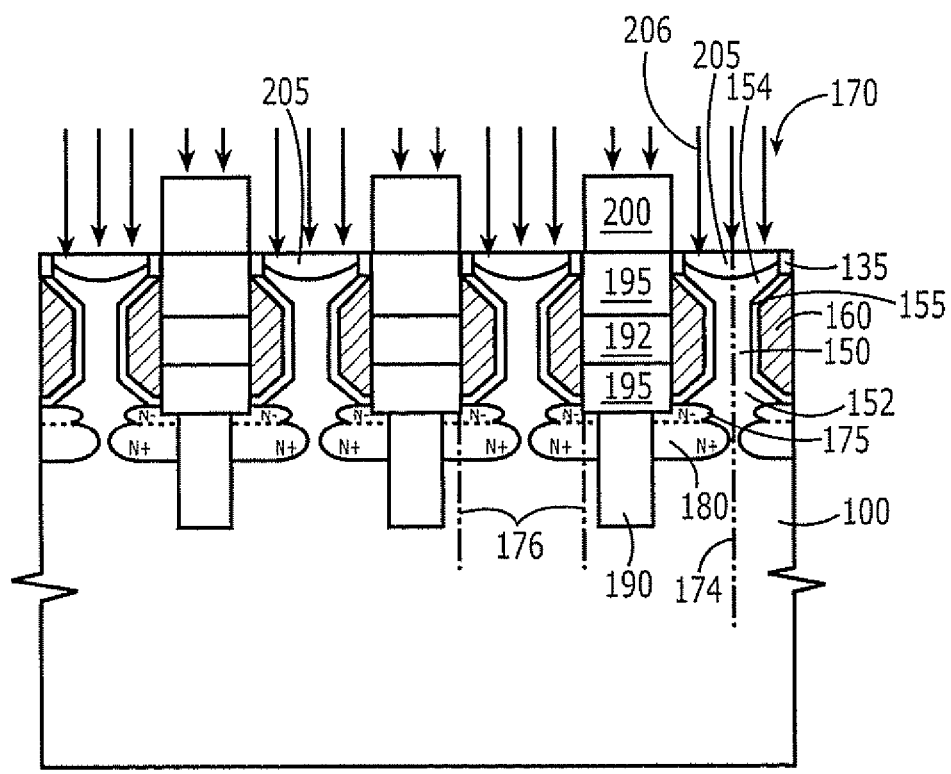

Finally, referring to FIG. 3J, the transistor may be completed by forming source/drain regions 205 (also referred to as fourth source drain regions 205) in the top 154 by implanting third ions 206 into the substrate as masked by a photoresist 200, as shown. Orthogonal implantation as shown and/or oblique implantation may be used. Prior to and/or after forming the source/drain regions 205, a word line and/or other region(s) 192 may be formed in the second trenches 140, and the second trenches may also be filled by an interlayer dielectric 195 using conventional techniques.

Accordingly, FIG. 3J also illustrates field effect transistors according to first embodiments of the present invention that comprise a substrate 100, a pillar 170 that extends away from the substrate 100, the pillar including a base 152 adjacent the substrate 100, a top 154 remote from the substrate 100 and a sidewall 145 that extends between the base 152 and the top 154. An insulated gate 155/160 is provided on the sidewall 145. A first source/drain region 175 is provided in the substrate 100 beneath the pillar 170 and adjacent the insulated gate 155/160. A second source/drain region 180 that is heavily doped compared to the first source/drain region 175, is provided in the substrate 100 beneath the pillar 170 and remote from the insulated gate 155/160.

As also shown in FIG. 3J, in some embodiments, the pillar 170 is an I-shaped pillar that is narrower between the base 152 and top 154, compared to adjacent the base 152 and top 154, such that the recessed sidewall 145 defines an intermediate portion 150 between the base 152 and top 154, and the insulated gate comprises an insulating layer 155 that extends on the intermediate portion 150, and a gate electrode 160 on the insulating layer 155 remote from the sidewall 145. The base 152 and top 154 may be of the same width or they may be of different widths in some embodiments. In still other embodiments, a trench isolation region 190 is provided in the substrate 100 outside the pillar 170, and the first and second source/drain regions 175/180 extend in the substrate adjacent the trench isolation region 190. Moreover, the second source/drain regions 180 may extend further toward a central axis 174 of the pillar 170 than the first source/drain regions 175 in some embodiments. As also shown in FIG. 3J, in some embodiments, the first and second source/drain regions 175 both extend to beneath the intermediate portion 150. Source/drain regions 205 also may be provided in the pillar 170 adjacent the top 154.

Figure 4A:
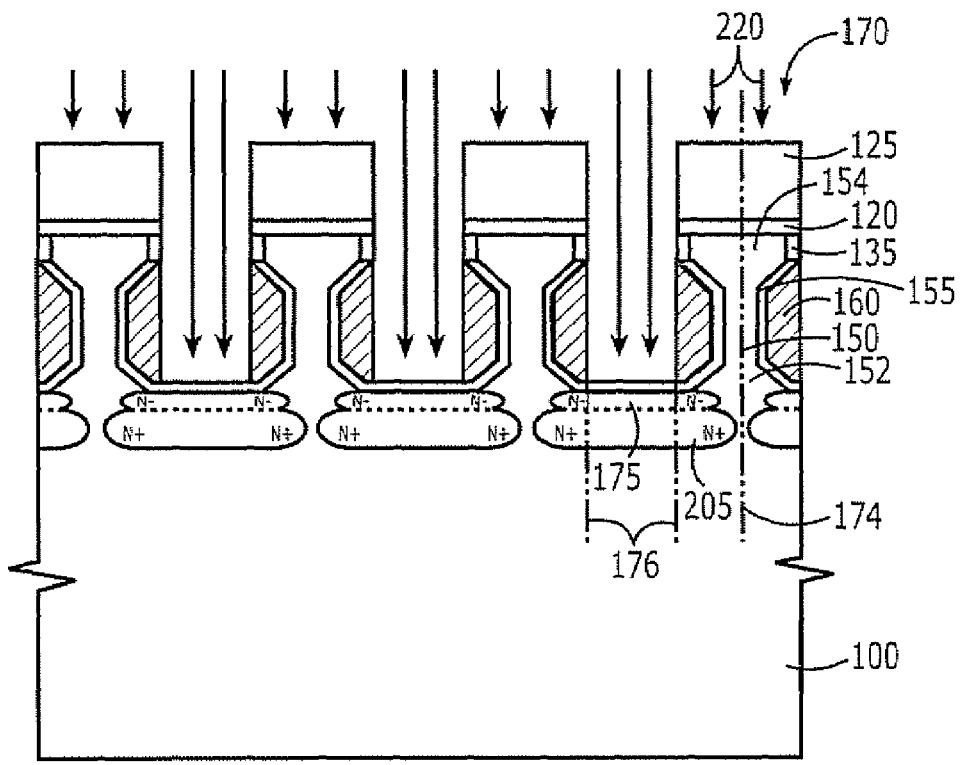
FIGS. 4A-4B are cross-sectional views of field effect transistors according to second embodiments of the present invention, during intermediate fabrication steps according to second embodiments of the present invention.
Figure 4B:
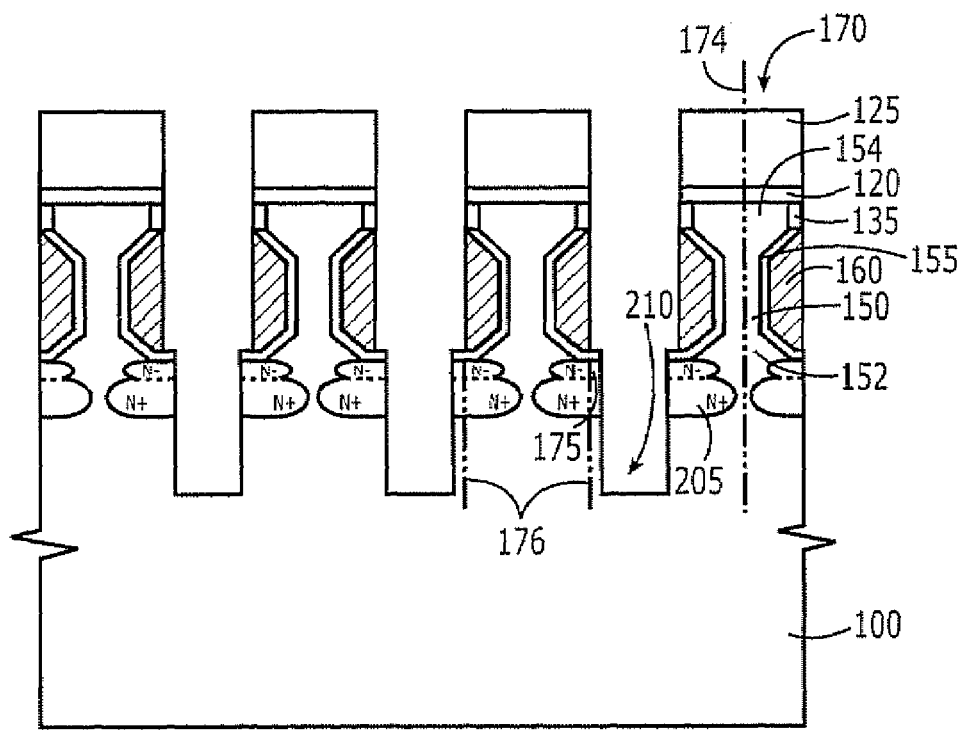

FIGS. 4A and 4B are side cross-sectional views of methods of fabricating field effect transistors according to second embodiments of the present invention, and field effect transistors so fabricated. From a structural standpoint, these second embodiments may produce the same structures as the first embodiments of FIGS. 3A-3J. However, the fabrication methods may differ.

In particular, referring to FIG. 4A, the operations of FIGS. 3A-3G may be performed. These operations will not be described again in the interest of brevity. Then, as shown in FIG. 4A, a second implant 220 may be performed at higher energy than the first implant 172 of FIG. 3G, to form second source/drain regions 205 that are heavily doped compared to the first source/drain regions 175, in the substrate 100 beneath the pillars 170 and remote from the insulated gates 155/160. It will also be understood that the implant 220 of FIG. 4A may be performed prior to the implant 172 of FIG. 3G. An orthogonal implant may be used, although oblique implant(s) also may be used in other embodiments.

Then, referring to FIG. 4B, the third trenches 210 are formed, similar to the formation of the third trenches 185 in FIG. 3H. An anneal may then be performed. The transistor may then be completed, as was already described in FIGS. 3I and 3J.

Figure 5A:
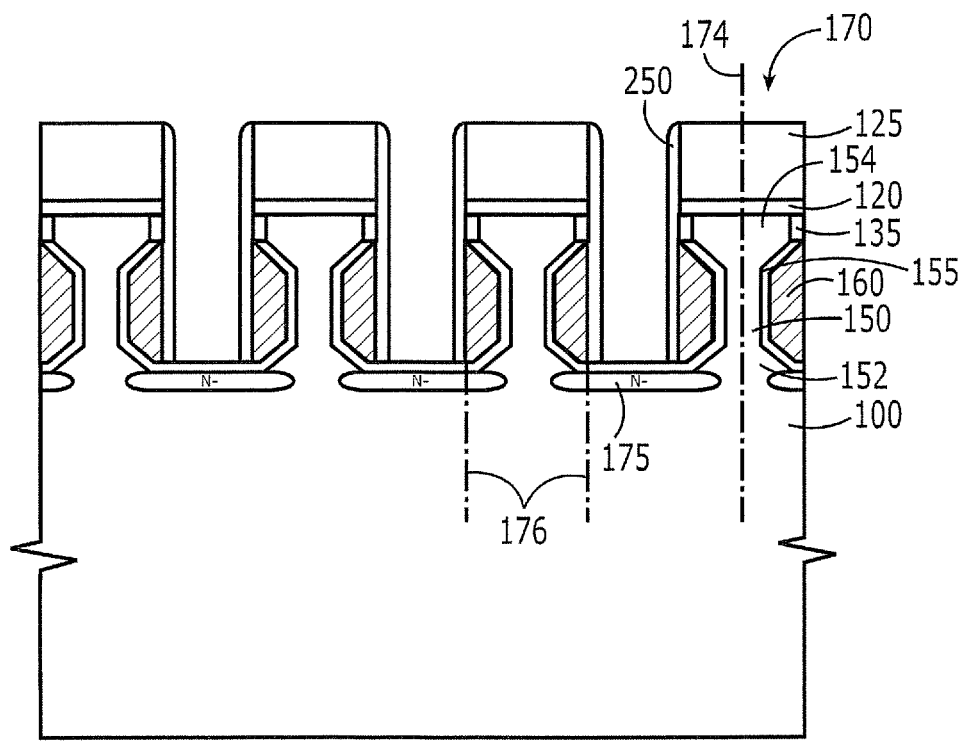
FIGS. 5A-5B are cross-sectional views of field effect transistors according to third embodiments of the present invention, during intermediate fabrication steps according to third embodiments of the present invention.
Figure 5B:
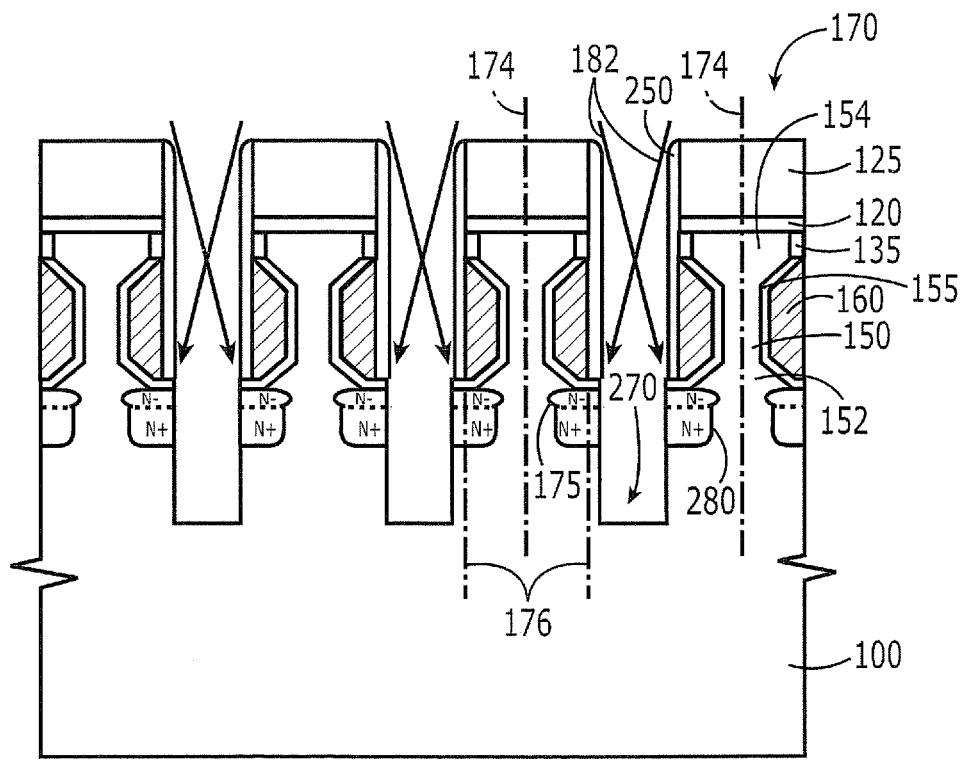

FIGS. 5A and 5B are side cross-sectional views of methods of fabricating field effect transistors according to third embodiments of the present invention, and field effect transistors so fabricated. Prior to performing the operations of FIG. 5A, the operations of FIGS. 3A-3G may be performed, to thereby form the first lightly doped (N−) source/drain regions 175. These operations will not be described again in the interest of brevity.

Then, as shown in FIG. 5A, gate spacers 250 are formed on the pillars 170, for example using a conventional chemical vapor deposition and etch back process. The gate spacer 250 may comprise oxide, nitride and/or other conventional spacer materials. Other conventional gate spacer fabrication techniques may be used.

Then, referring to FIG. 5B, a third trench 270 is formed using the gate spacer 250 as a mask, for example using a conventional dry etching process. A second implantation 182 of ions may be performed at higher energy than the first implantation 172 and at an oblique angle, as shown in FIG. 5B, to form second source/drain structures 280 beneath the first source/drain regions 175 that are more highly doped (N+). In other embodiments, an orthogonal implant may be used. An optional anneal may then take place to form the final source/drain structures shown in FIG. 51B. As shown in FIG. 5B, in these third embodiments, the first source/drain regions 175 extend further toward a central axis 174 of the pillars 170 than the second source/drain regions 280, by virtue of the second implantation 180 being performed through the gate spacer 250 and/or being performed at an oblique angle. The structure may then be completed as was described in FIGS. 3I and 3J. As shown in FIG. 5B, in these embodiments, the first source/drain regions extend to beneath the intermediate portions 150, whereas the second source/drain regions 280 only extend part way to beneath the intermediate portions 150. Moreover, as shown in FIG. 5B, in these embodiments, the trench 270 may extend to the sidewall spacer 250, so that the later formed trench isolation region 190 can extend in the substrate 100 from outside the pillar 170 to the sidewall spacer 250.

Figure 6A:
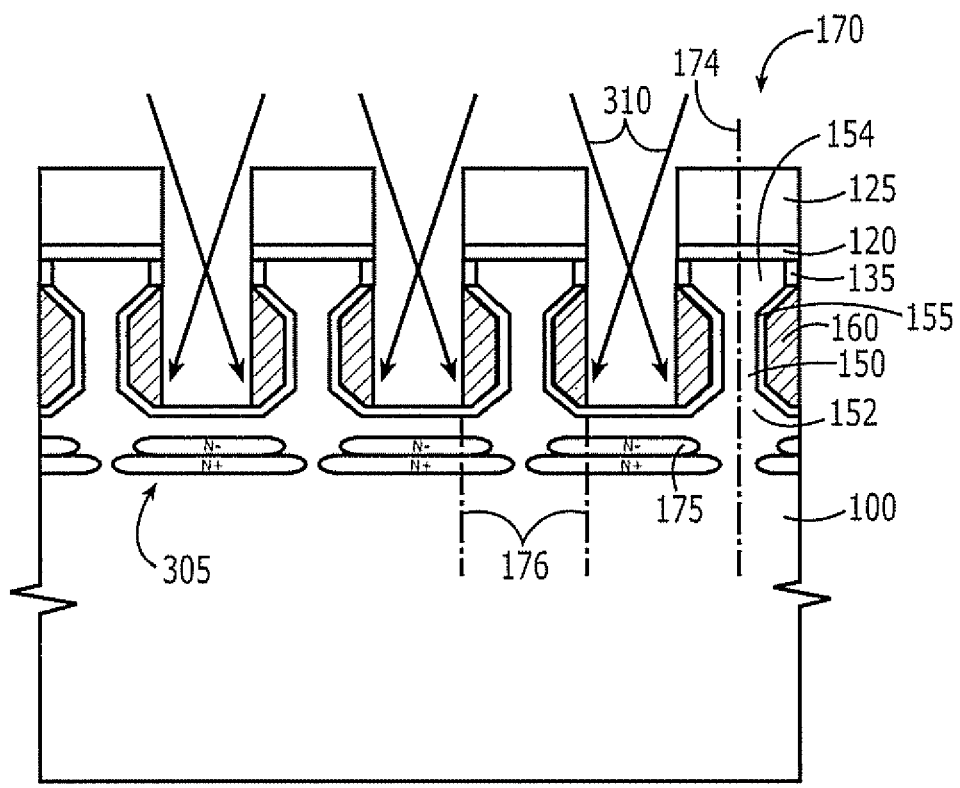
FIGS. 6A-6B are cross-sectional views of field effect transistors according to fourth embodiments of the present invention, during intermediate fabrication steps according to fourth embodiments of the present invention.
Figure 6B:
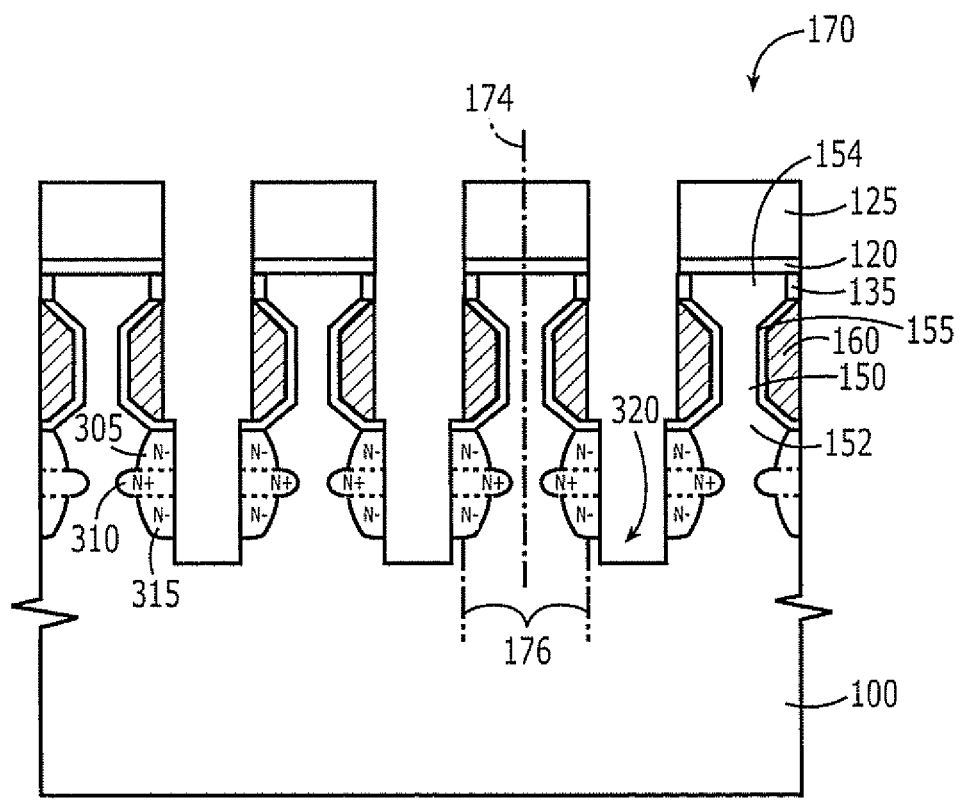

Finally, FIGS. 6A and 6B are cross-sectional views illustrating fabrication of field effect transistors according to fourth embodiments of the present invention, and field effect transistors so fabricated. Prior to performing the operations in FIG. 6A, the operations shown in FIGS. 3A-3G may be performed. These operations will not be discussed again for the sake of brevity.

Then, as shown in FIG. 6A, a second implant 310 is performed at higher energy and higher density than the first ion implantation 172, to implant second ions into the substrate 100 between the spaced apart pillars 170, as shown at region 305. In some embodiments, the second ions have shorter diffusivity than the first ions. For example, the first ions 172 may be phosphorus ions and the second ions 310 may be arsenic ions. As also shown in FIG. 6A, in some embodiments, the second ion implantation 310 may be performed at an oblique angle, but, in other embodiments, orthogonal implantation may be used. It will also be understood that the order of performing the first and second ion implants may be reversed.

Then, referring to FIG. 6B, an anneal is performed to diffuse the first ions 175 above and below the second ions 305, to thereby form second source/drain regions 310 (N+) beneath the pillars 170 and spaced apart therefrom, first source/drain regions 320 that are lightly doped (N−) compared to the second source/drain regions 310, between the second source/drain regions 310 and the pillars 170, and third source/drain regions 315 that are lightly doped (N−) compared to the second source/drain regions 310 beneath the second source/drain regions 310 and remote from the first source/drain regions 320. Finally, as shown in FIG. 6B, a third trench 320 may be etched as was already described above. The transistor may be completed as was already described above in connection with FIG. 3J.

Moreover, in some embodiments, as shown in FIG. 6B, the second source/drain regions 310 may extend further toward a central axis 174 of the pillar than the first and third source/drain regions 305 and 315, respectively. Moreover, as also shown in FIG. 6B, in some embodiments, the second source/drain region 310 extends to beneath the intermediate portion 150 of the pillars 170, whereas the first and third source/drain regions 305, 315 extend only part way to beneath the intermediate portions 150 of the pillars 170.

Figure 7:
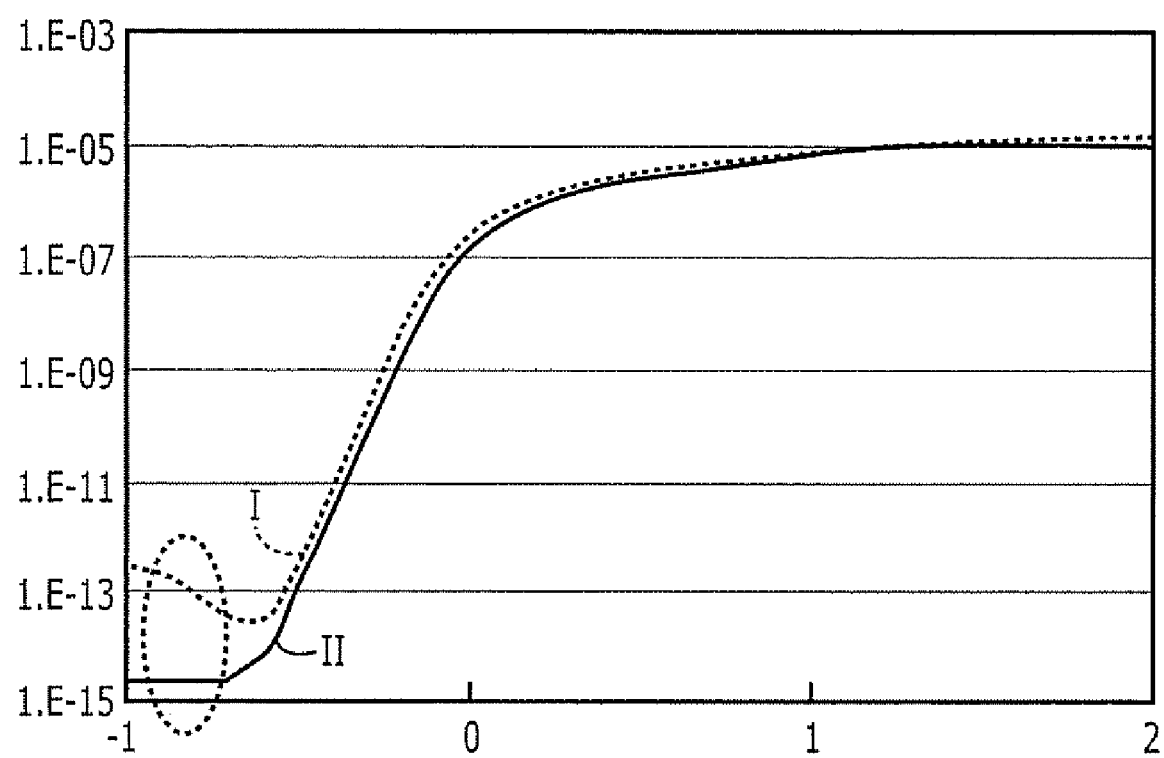
FIG. 7 graphically illustrates gate voltage versus leakage current for vertical field effect transistors according to embodiments of the present invention.

FIG. 7 graphically illustrates gate voltage versus leakage current for a vertical field effect transistor of FIG. 6B (I) and a vertical field effect transistor of FIG. 3J (II) according to some embodiments of the present invention. As shown in FIG. 7, for low values of gate voltage, a decrease in leakage current may be obtained by embodiments of FIG. 3J.

As described herein, some embodiments of the present invention can provide first and second source/drain regions in the substrate that extend beneath pillars. These extended N+ and N− source/drain regions can decrease gate-induced drain leakage, compared to conventional vertical field effect transistors, wherein one or both of the source/drain regions are outside the pillar and do not extend beneath the pillar.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. A field effect transistor comprising:
a substrate;
a pillar that extends away from the substrate, the pillar including a base adjacent the substrate, a top remote from the substrate and a sidewall that extends between the base and the top;
an insulated gate on the sidewall;
a first source/drain region in the substrate beneath the pillar and adjacent the insulated gate; and
a second source/drain region that is of same conductivity type as, and is heavily doped compared to, the first source/drain region, in the substrate beneath the pillar and remote from the insulated gate,
wherein the second source/drain region extends further toward a central axis of the pillar than the first source/drain region.

2. The field effect transistor according to claim 1, wherein the pillar is an I-shaped pillar that is narrower between the base and the top compared to adjacent the base and the top such that the sidewall includes a recessed portion between the base and the top, and wherein the insulated gate comprises an insulating layer that extends on the recessed portion and a gate electrode on the insulating layer remote from the sidewall.

3. The field effect transistor according to claim 2, further comprising a sidewall spacer on the gate electrode remote from the insulating layer.

4. The field effect transistor according to claim 1, further comprising a trench isolation region in the substrate outside the pillar and wherein the first and the second source/drain regions extend in the substrate adjacent the trench isolation region.

5. The field effect transistor according to claim 4, further comprising a sidewall spacer on the sidewall, wherein the trench isolation region extends in the substrate from outside the pillar to the sidewall spacer.

6. The field effect transistor according to claim 1, further comprising a third source/drain region that is of same conductivity type as, and is lightly doped compared to, the second source/drain region, in the substrate beneath the pillar and beneath the second source/drain region.

7. The field effect transistor according to claim 6, wherein the second source/drain region extends further toward a central axis of the pillar than the third source/drain regions.

8. The field effect transistor according to claim 1, wherein the first and the second source/drain regions extend to beneath the recessed portion.

9. The field effect transistor according to claim 1, wherein the first source/drain region extends to beneath the recessed portion and wherein the second source/drain region extends only part way to beneath the recessed portion.

10. The field effect transistor according to claim 1, wherein the second source/drain region extends to beneath the recessed portion and wherein the first and the third source/drain regions extend only part way to beneath the recessed portion.

11. The field effect transistor according to claim 1, further comprising:
a fourth source/drain region in the pillar adjacent the top.

12. A field effect transistor comprising:
a substrate;
an I-shaped pillar that extends away from the substrate, the I-shaped pillar including a pair of opposing sidewalls, a base adjacent the substrate, a top remote from the substrate and an intermediate portion between the base and top that is narrower than the base and the top;
an insulated gate on the pair of opposing sidewalls of the intermediate portion;
a first source/drain region in the substrate beneath the I-shaped pillar and adjacent the base; and
a second source/drain region that is heavily doped compared to the first source/drain region, in the substrate beneath the I-shaped pillar and remote from the base; and
wherein the second source/drain region extends further toward a central axis of the I-shaped pillar than the first source/drain region.

13. The field effect transistor according to claim 12, wherein the insulated gate comprises an insulating layer on the pair of opposing sidewalls of the intermediate portion and a gate electrode on the insulating layer on the pair of opposing sidewalls, remote from the I-shaped pillar.

14. The field effect transistor according to claim 13, further comprising a sidewall spacer on the gate electrode remote from the insulating layer.

15. The field effect transistor according to claim 12, further comprising a trench isolation region in the substrate outside the I-shaped pillar and adjacent the pair of opposing sidewalls, and wherein the first and the second source/drain regions extend in the substrate adjacent the trench isolation region.

16. The field effect transistor according to claim 12, further comprising:
a third source/drain region that is lightly doped compared to the second source/drain region, in the substrate beneath the I-shaped pillar and remote from the first source/drain region.

17. The field effect transistor according to claim 16, wherein the second source/drain region extends further toward a central axis of the I-shaped pillar than the third source/drain regions.

18. The field effect transistor according to claim 16 wherein the second source/drain region extends to beneath the intermediate portion and wherein the first and the third source/drain regions extend only part way to beneath the intermediate portion.

19. The field effect transistor according to claim 12 wherein the first and the second source/drain regions extend to beneath the intermediate portion.

20. The field effect transistor according to claim 12 wherein the first source/drain region extends to beneath the intermediate portion and wherein the second source/drain region extends only part way to beneath the intermediate portion.

21. The field effect transistor according to claim 12 further comprising:
a fourth source/drain region in the I-shaped pillar adjacent the top.

* * * * *